(12) United States Patent
Morrow et al.

(10) Patent No.: US 7,129,172 B2
(45) Date of Patent: Oct. 31, 2006

(54) BONDED WAFER PROCESSING METHOD

(75) Inventors: Patrick Morrow, Portland, OR (US); R. Scott List, Beaverton, OR (US); Michael Y. Chan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/811,758

(22) Filed: Mar. 29, 2004

(65) Prior Publication Data

US 2005/0215056 A1   Sep. 29, 2005

(51) Int. Cl.
*H01L 21/302* (2006.01)
(52) U.S. Cl. .................... 438/690; 438/455; 438/459; 438/706; 438/745; 438/977
(58) Field of Classification Search ............... 216/33, 216/36, 52, 58, 83; 438/455, 459, 690, 706, 438/745, 977
See application file for complete search history.

(56) References Cited

U.S. PATENT DOCUMENTS 5,937,312 A * 8/1999 Iyer et al. .................. 438/459
6,841,848 B1 * 1/2005 MacNamara et al. ....... 257/618

FOREIGN PATENT DOCUMENTS

JP   10-335195   * 12/1998

* cited by examiner

*Primary Examiner*—George A. Goudreau

(74) *Attorney, Agent, or Firm*—Blakely, Sokoloff, Taylor & Zafman LLP

(57) ABSTRACT

According to one embodiment a method is disclosed. The method includes applying a photoresist layer to a first wafer, etching the first wafer, bonding the first wafer to a second wafer and thinning the first wafer; wherein an unsupported bevel portion of the first wafer is removed.

22 Claims, 5 Drawing Sheets

BONDED WAFER PROCESSING METHOD

FIELD OF THE INVENTION

The present invention relates to silicon processing; more particularly, the present invention relates to processing bonded wafers.

BACKGROUND

Three-Dimensional Structure (3DS) integrated circuits (ICs) allows for physical separation of circuits and the control logic onto different layers such that each layer may be separately optimized. Fabrication of 3DS ICs involves aligning and bonding to a common substrate a topside of a second circuit substrate, grinding the backside or exposed surface of the second circuit substrate to a predetermined thickness, and then polishing the surface.

A problem, however, often occurs during the grinding step. The wafer substrate that is to be grinded includes a bevel component that is unsupported during the grinding step of the process. Therefore, whenever pressure from the grinder is applied to thin the wafer substrate, the unsupported component may chip.

Edge chipping is considered a serious problem in the fabrication process since it may result in relatively large portions of the wafer substrate being delaminated. Delamination may potentially lead to down stream processing inefficiencies and/or yield problems on the edge of the substrate.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A bonded wafer processing method is described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
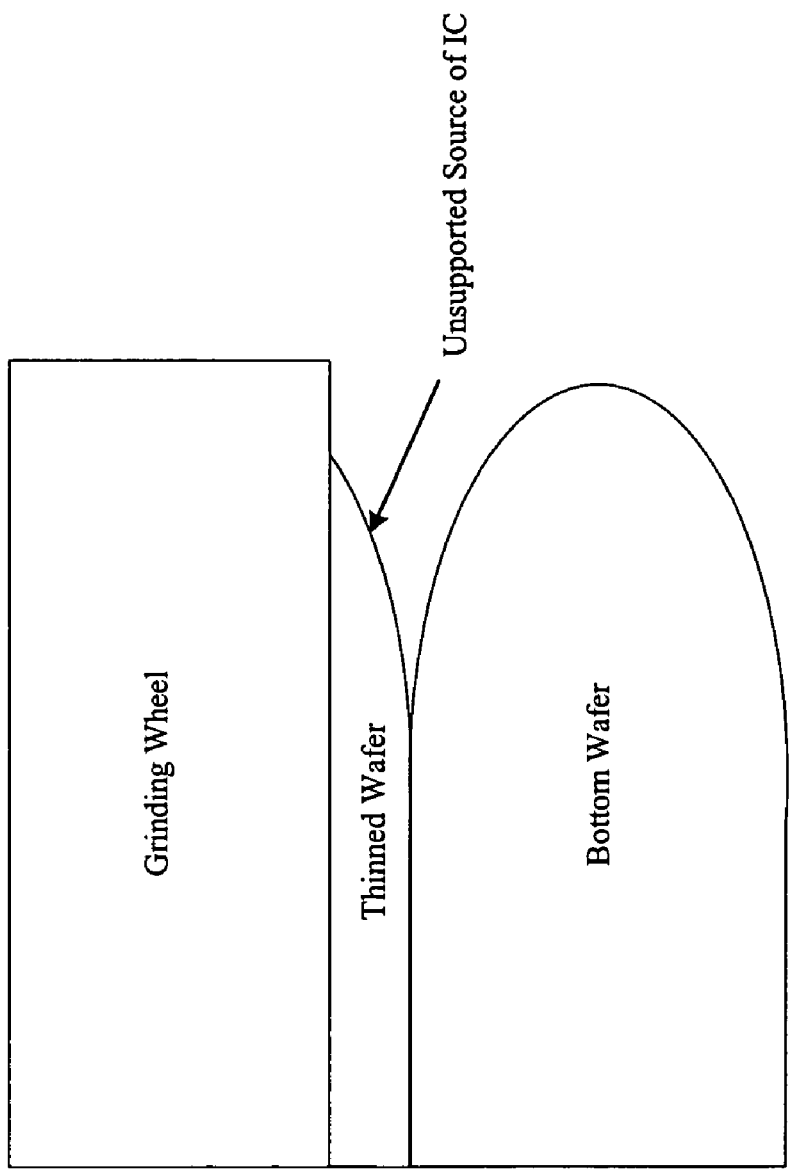
FIG. 1 illustrates an exemplary process flow for grinding a wafer.

FIG. 1 illustrates an exemplary process flow for grinding a wafer substrate. As shown in FIG. 1, a grinding wheel thins a top wafer of a bonded pair of wafers. The bevel of the top wafer is an area that is unsupported by the bottom wafer. Thus, as the grinder asserts pressure at the top wafer, portions of the bevel beyond the unsupported area may be chipped away, resulting in the possibility of relatively large portions of the top wafer being delaminated.

Figure 2:
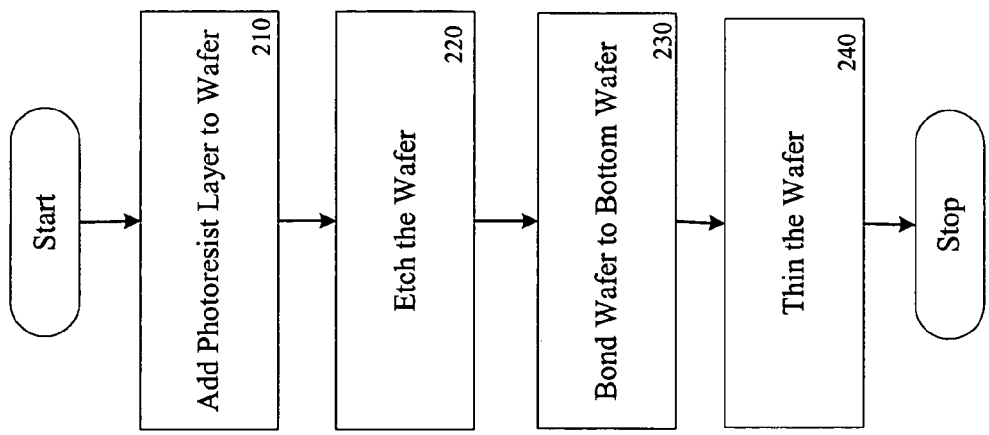
FIG. 2 is a flow diagram illustrating one embodiment of a bonding process.

According to one embodiment, a step is added to the bonding process to prevent the chipping of an unsupported area of a wafer to be thinned. FIG. 2 is a flow diagram illustrating one embodiment of a bonding process to prevent the chipping or damaging of a wafer to be thinned. At processing block 210, a photoresist layer is applied to a wafer that is to be thinned. The photoresist is applied to protect an active portion of the wafer.

Figure 3:
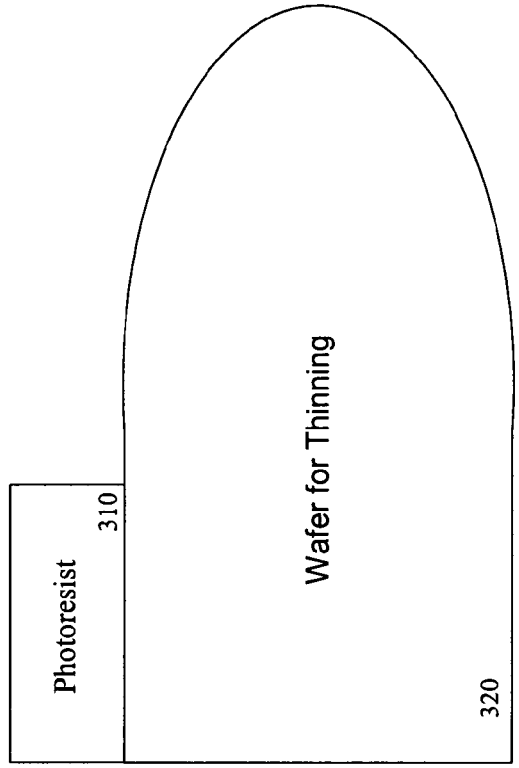
FIG. 3 illustrates one embodiment of a wafer with a photo resist layer.

FIG. 3 illustrates one embodiment of a photo resist layer 310 applied at a wafer 320. As shown in FIG. 3, the photoresist layer is applied to the straight portion of wafer 320, which is the area before wafer 320 begins to curve.

Referring back to FIG. 2, wafer 320 is etched after photoresist layer 310 is applied, processing block 220. In one embodiment, wafer 320 is etched using a dry etching method. However, those skilled in the art will recognize that other etching methods may be implemented (e.g., wet etching). Subsequently, photoresist layer 310 is delaminated from wafer 320.

Figure 4:
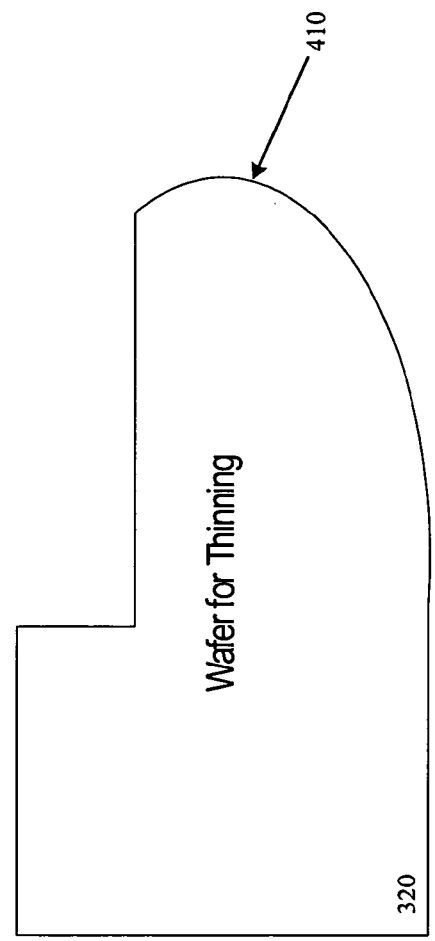
FIG. 4 illustrates one embodiment of a wafer after etching.

FIG. 4 illustrates one embodiment of wafer 320 after etching and the stripping of photoresist layer 310. Notice that wafer 320 includes a bevel component 410. The bevel component 410 will be grinded off during the thinning step of the process.

Figure 5:
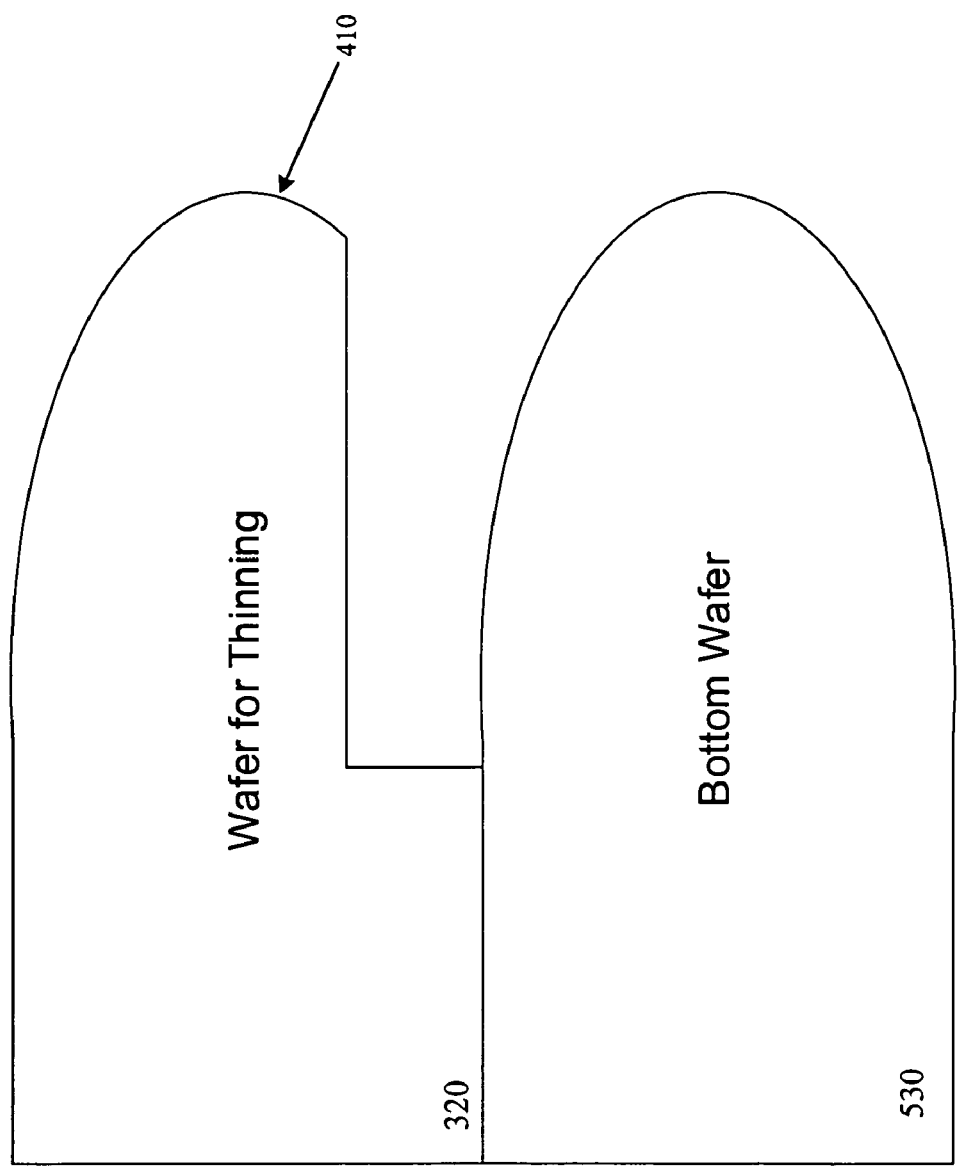
FIG. 5 illustrates one embodiment of bonded wafers.

Referring back to FIG. 2, wafer 320 is bonded to a bottom wafer at processing block 230. According to one embodiment, wafer 320 is bonded to the bottom wafer via a direct bonding method. However, one of ordinary skill in the art will appreciate that other bonding methods may be implemented (e.g., metal diffusion, anodic, etc.). FIG. 5 illustrates one embodiment of the process after wafer 320 has been bonded to a bottom wafer 530.

Figure 6:
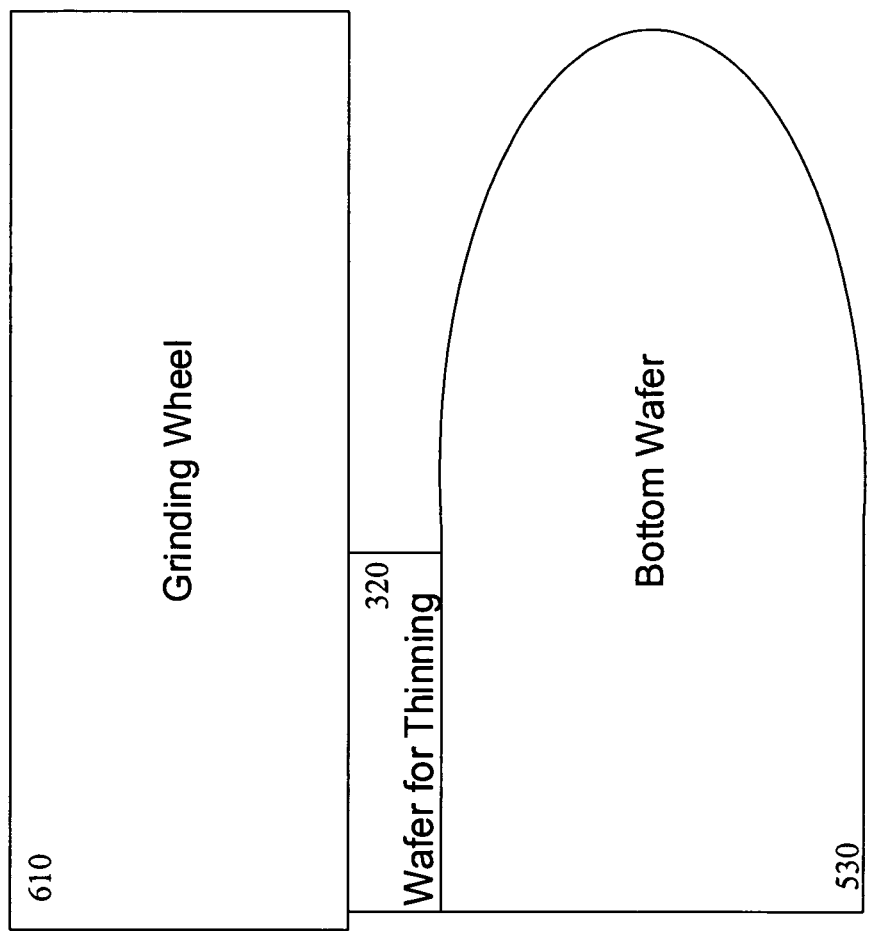
FIG. 6 illustrates one embodiment of bonded wafers after the thinning process.

Referring back to FIG. 2, wafer 320 is thinned by a grinder after being bonded to wafer 530, processing block 240. FIG. 6 illustrates one embodiment of bonded wafers after the thinning process. As shown in FIG. 6, a grinding wheel 610 has been applied to the thinned wafer 320, which is bonded to wafer 530. According to one embodiment, the unsupported bevel portion 430 of wafer 320 is ground off during the thinning process. Thus, chipping or damage that may have occurred on the unsupported bevel portion 430 is removed without effecting the remaining portion of wafer 320.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A method comprising:
   applying a photoresist layer to a first substrate to protect a portion having a first circuit;
   etching a portion of the first substrate that is not protected by the photoresist layer;

bonding the first substrate to a second substrate after said etching; and thinning the first substrate to remove a bevel portion of the first substrate.

2. The method of claim 1, wherein said etching comprises etching a curved portion that extends beyond a flat portion having the first circuit, the curved portion curved so that it would not have been supported by the second substrate when the first and second substrates were bonded.

3. The method of claim 1, wherein said applying comprises applying the photoresist layer to a wafer.

4. The method of claim 1, wherein said bonding comprises bonding the portion of the first substrate having the first circuit to the second substrate.

5. The method of claim 1, wherein said bonding comprises bonding the first substrate to a second substrate having a second circuit.

6. The method of claim 1, further comprising stripping the photoresist layer after said etching.

7. The method of claim 1, wherein said etching comprises dry etching.

8. The method of claim 1, wherein said etching comprises wet etching.

9. The method of claim 1, wherein said thinning comprises grinding the first substrate.

10. The method of claim 1, wherein said applying comprises applying the photoresist layer to a flat area just before a curved area.

11. A method comprising:

removing a first portion of a first substrate that is not an active component;

bonding the active component of the first substrate to a second substrate; and thinning the first substrate to remove an unsupported component of the first substrate.

12. The method of claim 11, wherein said removing the first portion comprises:

applying a photoresist layer to cover the active component of the first substrate; and etching the first portion of the first substrate.

13. The method of claim 11, wherein said removing the first portion comprises etching a curved portion that extends beyond a flat portion having the active component, the curved portion curved so that it would not have been supported by the second substrate when the first and second substrates were bonded.

14. The method of claim 11, wherein said bonding comprises bonding wafers.

15. The method of claim 11, wherein said bonding comprises bonding the active component of the first substrate to a second substrate having a circuit.

16. The method of claim 11, wherein said thinning the first substrate comprises grinding the first substrate.

17. A method comprising:

forming a layer over a first circuit of a first substrate;

removing a portion of the first substrate that is not under the layer;

bonding the first circuit of the first substrate to a second substrate having a second circuit after said removing the layer; and thinning the first substrate to remove a portion that is not supported by the second substrate.

18. The method of claim 17, wherein said removing the portion of the first substrate comprises removing a curved portion that extends beyond a flat portion having the first circuit, the curved portion curved so that it would not have been supported by the second substrate when the first and second substrates are bonded.

19. The method of claim 17, wherein said forming comprises applying a photoresist layer to a wafer.

20. The method of claim 17, wherein said removing the portion of the first substrate comprises etching the first substrate, wherein said removing the layer comprises stripping the layer, and wherein said thinning the first substrate comprises grinding the first substrate.

21. The method of claim 1, wherein the portion having the first circuit comprises an active portion, and wherein the bevel portion comprises an unsupported portion.

22. The method of claim 17, wherein the first circuit is in an active portion of the first substrate.

* * * * *

UNITED STATES PATENT AND TRADEMARK OFFICE
CERTIFICATE OF CORRECTION

| | | |
|---|---|---|
| PATENT NO. | : 7,129,172 B2 | Page 1 of 1 |
| APPLICATION NO. | : 10/811758 | |
| DATED | : October 31, 2006 | |
| INVENTOR(S) | : Morrow et al. | |

It is certified that error appears in the above-identified patent and that said Letters Patent is hereby corrected as shown below:

In column 4, at line 16, after "the layer;" insert --removing the layer;--

Signed and Sealed this

First Day of May, 2007

JON W. DUDAS
*Director of the United States Patent and Trademark Office*